(12) United States Patent
Mitani et al.

(10) Patent No.: US 7,015,121 B2
(45) Date of Patent: Mar. 21, 2006

(54) SEMICONDUCTOR DEVICE AND METHOD OF MANUFACTURING THE SAME

(75) Inventors: Yuichiro Mitani, Minato-ku (JP); Yukie Nishikawa, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/910,578

(22) Filed: Aug. 4, 2004

(65) Prior Publication Data

US 2005/0009306 A1 Jan. 13, 2005

Related U.S. Application Data

(62) Division of application No. 10/246,629, filed on Sep. 19, 2002, now Pat. No. 6,787,433.

(30) Foreign Application Priority Data

Sep. 19, 2001 (JP) .............................. 2001-284869

(51) Int. Cl.
   *H01L 21/20* (2006.01)
(52) U.S. Cl. .................... 438/479; 438/482; 438/486; 438/488
(58) Field of Classification Search ........ 438/479–482, 438/486, 488
   See application file for complete search history.

(56) References Cited

U.S. PATENT DOCUMENTS

| 4,808,546 | A | 2/1989 | Moniwa et al. .............. 438/166 |
| 5,037,774 | A | 8/1991 | Yamawaki et al. ............ 117/8 |
| 5,403,673 | A | 4/1995 | Haga et al. ................. 428/688 |
| 5,970,339 | A | 10/1999 | Choi .......................... 438/243 |
| 6,610,548 | B1 * | 8/2003 | Ami et al. ..................... 438/3 |
| 6,743,292 | B1 * | 6/2004 | Jia et al. ..................... 117/108 |
| 6,899,965 | B1 * | 5/2005 | Nishikawa et al. ......... 428/701 |
| 2003/0008521 | A1 | 1/2003 | Bojarczuk et al. .......... 438/752 |

OTHER PUBLICATIONS

C.G. Kim, et al., *Jpn. J. Appl. Phys.*, vol. 40, Pt. 1, No. 8, pp. 4769-4773 (2001).

* cited by examiner

Primary Examiner—T. N. Quach
(74) Attorney, Agent, or Firm—Oblon, Spivak, McClelland, Maier & Neustadt, P.C.

(57) ABSTRACT

A method of manufacturing a semiconductor device comprises a step of depositing a crystalline insulating layer oriented in a predetermined crystal face orientation by epitaxial growth on an amorphous semiconductor layer, a step of depositing a second amorphous semiconductor layer on the crystalline insulating layer, a step of growing said first and second semiconductor layers into a polycrystal or single crystal layer in a solid phase, using said crystalline insulating film as core, and a step of forming a functional element containing said first and second semiconductor layer.

5 Claims, 10 Drawing Sheets

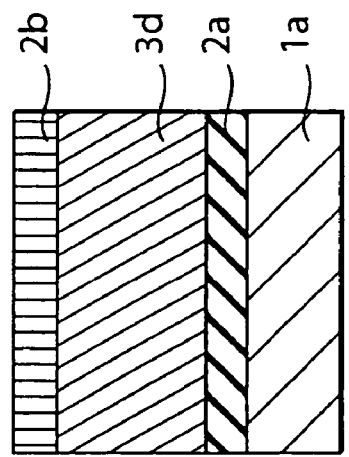
FIG. 10(e)
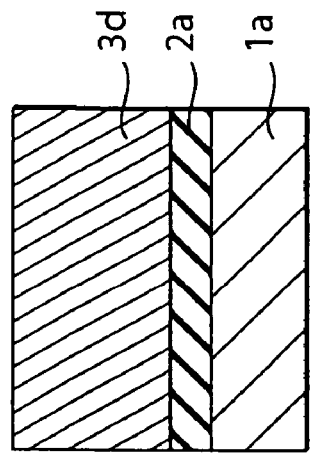
FIG. 10(f)
FIG. 10(c)
FIG. 10(d)
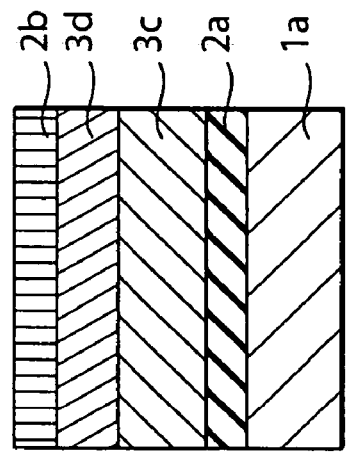
FIG. 10(a)
FIG. 10(b)
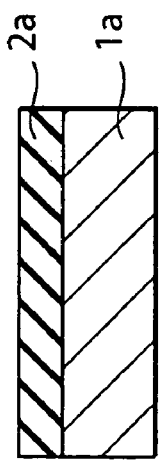
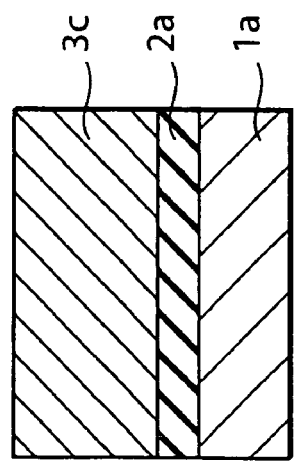

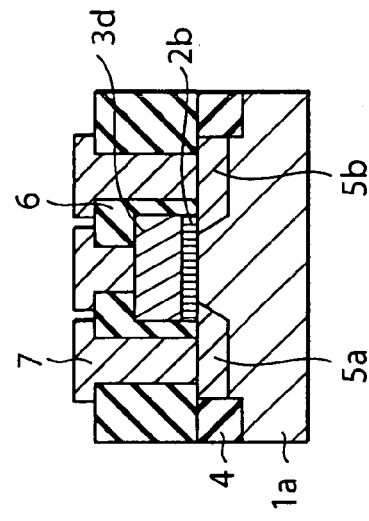
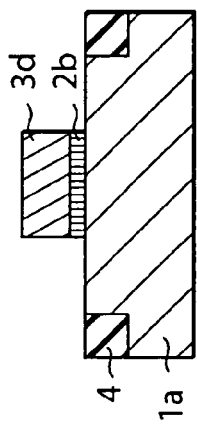
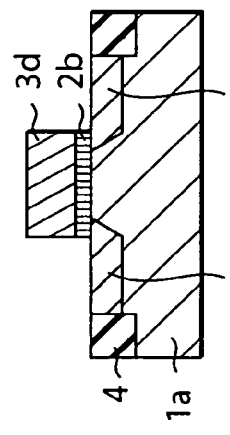
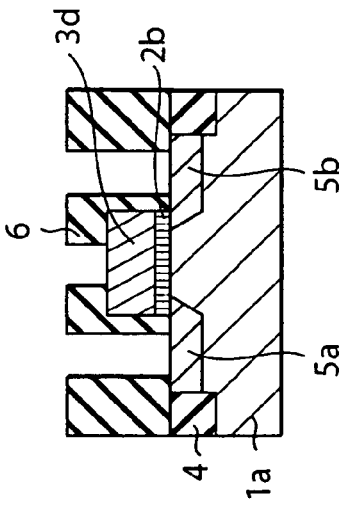
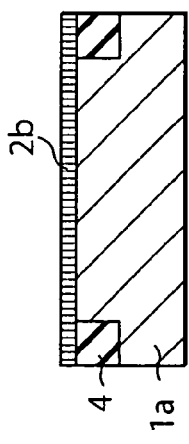
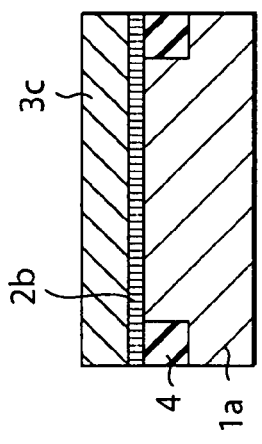
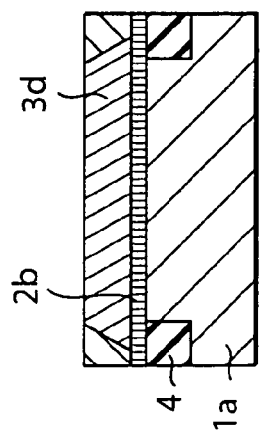

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2001-284869, filed on Sep. 19, 2001; the entire contents of which are incorporated herein by reference.

BACKGROUND OF THE INVENTION

1. Field of the Invention

This invention relates to a semiconductor device and a method of manufacturing the same.

2. Related Background Art

In recent years, the demand for high performance microsilicon devices has been remarkably increasing. Such devices typically include electrically writable/erasable nonvolatile semiconductor memories (EEPROMs), logical devices and thin film transistors. Of these devices, nonvolatile semiconductor memories and logical devices require reducing the film thickness of the gate insulating film in order to be downsized without sacrificing their performances. However, conventional silicon oxide film and silicon nitride film intrinsically accompany the problem of increased leak current as tradeoff for the reduction of film thickness. It is difficult for such films to be further downsized and, at the same time, show improved performances.

In view of this problem, there have been developed techniques for using high dielectric film typically made of titanium oxide, zirconium oxide or hafnium oxide that shows a dielectric constant higher than silicon oxide film or silicon nitride film as gate insulating film for the purpose of reducing the leak current and achieving a high insulation effect by increasing the actual film thickness, while maintaining the film thickness reduced to oxide film. However, there is still a strong demand for a higher insulation effect.

Furthermore, there have been developed techniques for regulating the work function and reducing the resistance of such devices by using polycrystalline silicon for the gate electrode and doping it with p type and n type impurities. However, there is still a strong demand for reducing the resistance of the gate electrode and other components of the device.

Meanwhile, in the case of thin film transistors that are typically used for liquid crystal devices, there is a demand for devices having a channel silicon layer that shows increased carrier mobility and is capable of operating with an enhanced level of reliability in order to provide improved functions and performances and high speed operations. Efforts are being paid to poly-crystallize the channel silicon layer and control the crystal grain size thereof by optimizing the channel silicon layer forming conditions including the film forming conditions and the annealing conditions in order to meet the demand. However, there is still a strong demand for devices whose channel silicon layer shows improved carrier mobility and operates with an enhanced level of reliability.

Also efforts are being paid to develop transistors using a single crystal silicon channel formed on an insulating film referred to as SOI (silicon on insulator) substrate in order to realize high speed operations of semiconductor devices.

In the case of an SOI substrate, by a known method, oxygen ions are injected into the silicon substrate by applying a high acceleration voltage from the surface thereof and then the substrate is annealed at high temperature so as to produce an $SiO_2$ layer in the middle of the substrate. However, defects can be produced on the surface silicon film with this method. There is also a known method by which a silicon substrate provided with a silicon oxide film and an ordinary silicon substrate are bonded together with the silicon oxide film sandwiched by the two substrates and the surface of one of the substrates is polished to produce an SOI substrate. However, this method involves a large number of manufacturing steps to raise the cost of the produced substrate.

As pointed out above, there is still a strong demand for gate insulating films showing an improved insulating effect, gate electrodes with reduced resistance and channel silicon layers showing improved carrier mobility and an enhanced level of reliability.

In view of the above identified circumstances, it is therefore an object of the present invention to provide a semiconductor device and a method of manufacturing the same that can improve the insulating effect of the gate insulating film, reduce the resistance of the gate electrode and improve the carrier mobility and the reliability of the channel silicon layer.

Another object of the present invention is to provide a semiconductor device and a method of manufacturing the same by using a substrate that shows a SOI structure with a defect-free silicon layer and can be produced with a reduced number of manufacturing steps.

BRIEF SUMMARY OF THE INVENTION

In an aspect of the invention, the above objects are achieved by providing a method of manufacturing a semiconductor device comprising:

contacting an amorphous semiconductor layer and a crystalline insulating layer oriented in a predetermined crystal face orientation, growing the amorphous semiconductor layer in a solid phase by using the insulating layer as core (nuclei) and producing a polycrystal or single crystal semiconductor layer with a unified crystal face orientation; and forming a functional element on the basis of the polycrystal or single crystal semiconductor layer.

Preferably, the insulating layer is formed by depositing oxide of a rare earth metal on the amorphous semiconductor layer by epitaxial growth at temperature between 300° C. and 700° C. under oxygen partial pressure between $1 \times 10^{-8}$ and $1 \times 10^{-5}$ Torr.

Preferably, the rare earth metal oxide is $CeO_2$.

Preferably, the crystal face orientation of the insulating layer is (110) or (111).

It is practically useful when the solid phase growth of the amorphous semiconductor layer is conducted at temperature between 400° C. and 1,000° C.

Preferably, the amorphous semiconductor layer is made of Si and the insulating layer is made of $CeO_2$.

In another aspect of the present invention, there is provided a method of manufacturing a semiconductor device comprising:

depositing a crystalline insulating layer showing a predetermined crystal face orientation on a first semiconductor layer by epitaxial growth;

depositing an amorphous semiconductor layer on the insulating layer;

forming a crystalline layer by growing the amorphous semiconductor layer in a solid phase, using the insulating layer as core; and forming a functional element in the crystalline layer.

The first semiconductor layer may be a polycrystal or single crystal layer.

The first semiconductor layer may be an amorphous layer, which may be crystallized by solid phase growth, using the insulating layer as core.

In still another aspect of the invention, there is provided a method of manufacturing a semiconductor device comprising:

depositing an amorphous Si layer on an insulating substrate containing Si;

depositing a crystalline insulating layer oriented in a predetermined crystal face orientation by growing a $CeO_2$ layer on the amorphous Si layer;

forming a polycrystal or single crystal semiconductor substrate by growing the amorphous Si layer in a solid phase, using the crystalline insulating of $CeO_2$ as core; and forming a functional element in the semiconductor substrate.

In still another aspect of the invention, there is provided a method of manufacturing a semiconductor device comprising:

forming a crystalline insulating layer oriented in a predetermined crystal face orientation on a first semiconductor layer by epitaxial growth;

depositing an amorphous second semiconductor layer on the insulating layer;

growing the amorphous second semiconductor layer in a solid phase, using the insulating layer as core;

removing the insulating layer and the second semiconductor layer except the regions for making a gate insulating film and a gate electrode; and forming a MIS transistor by diffusing an impurity of the conductivity type opposite to the first semiconductor layer at the opposite sides of the regions, thereby forming source and drain regions.

In still another aspect of the invention, there is provided a method of manufacturing a semiconductor device comprising:

growing a crystalline insulating layer oriented in a predetermined crystal face orientation on an amorphous first semiconductor layer;

depositing an amorphous second semiconductor layer on the crystalline insulating layer;

growing at least the first semiconductor layer in a solid phase, using the crystalline insulating layer as core;

removing the crystalline insulating layer and the second semiconductor layer by etching except regions the regions for making a gate insulating film and a gate electrode; and forming a MIS transistor by diffusing an impurity of the conductivity type opposite to the first semiconductor layer at the opposite sides of the regions, thereby forming source and drain regions.

In a further aspect of the invention, there is provided a semiconductor device including a MIS transistor, the device comprising:

a crystalline insulating layer formed by epitaxial growth with a crystal face orientation positioned between a first semiconductor layer and a second semiconductor layer;

at least either the first semiconductor layer or the second semiconductor layer being a polycrystal or single crystal semiconductor layer grown from an amorphous layer in a solid phase by using the insulating layer as core and showing a uniformly oriented crystal face orientation;

the first semiconductor layer being used as source/drain regions;

the second semiconductor layer being used as gate electrode.

BRIEF DESCRIPTION OF THE DRAWINGS

FIGS. 10(a) through 10(f) are schematic cross sectional views of an SOI substrate in different major manufacturing steps of another embodiment of method of manufacturing a semiconductor device according to the invention.

FIGS. 12(a) through 12(g) are schematic cross sectional views of an n-channel in different major manufacturing steps of another embodiment of method of manufacturing a semiconductor device according to the invention.

DETAILED DESCRIPTION OF THE INVENTION

Now, the present invention will be described in greater detail by referring to the accompanying drawings that illustrate preferred embodiments of the invention, although the invention is by no means limited to the specifically described embodiments, which may be modified in various different ways.

Figure 1A:
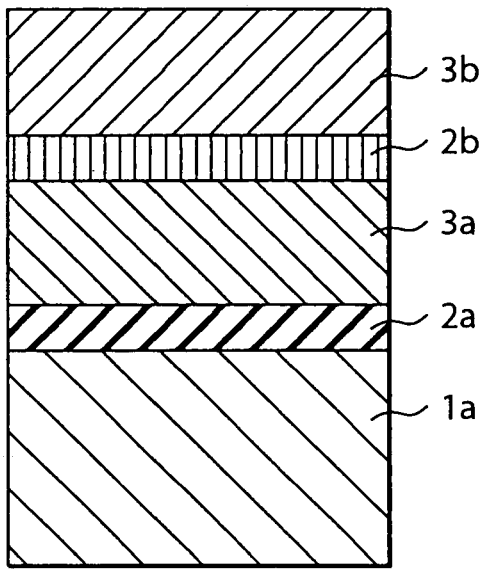
FIG. 1(a) is a schematic cross sectional view of an embodiment of semiconductor device according to the invention and FIG. 1(b) is a schematic cross sectional view of another embodiment of semiconductor device according to the invention.

FIG. 1(a) is a schematic cross sectional view of an embodiment of semiconductor device according to the invention, illustrating its structure.

Referring to FIG. 1(a) showing the semiconductor device, a first insulating layer 2a that is typically made of silicon oxide is formed on a single crystal p type silicon substrate 1a and then a first semiconductor layer 3a that is typically made of silicon is formed on the first insulating layer 2a. The starting structure of the first semiconductor layer 3a is amorphous and the layer 3a is made to have a plane surface. Then, a second insulating layer 2b is formed on the first semiconductor layer 3a by epitaxial growth. It is made of oxide of a rare earth element, which may typically be cerium oxide ($CeO_2$). The second insulating layer 2b of cerium oxide makes a polycrystal or single crystal layer showing a unified crystal face orientation regardless of the crystallinity of the underlying layer. The crystal face orientation of the second insulating layer 2b may well be (111) or (110) from the viewpoint of ease of orientation. A second semiconductor layer 3b typically made of silicon is formed on the second insulating layer 2b.

The crystalline insulating layer 2b produced by epitaxial growth shows a predetermined crystal face orientation of (111) and, if it has a polycrystalline structure, it is oriented in a predetermined crystal face orientation. The first and second semiconductor layers 3a and 3b are made to grow from an amorphous state into polycrystal or single crystal in a solid phase, using the crystalline insulating layer 2b as core. Note that both the first and second semiconductor layers 3a and 3b may be made to grow from an amorphous state into polycrystal or single crystal in a solid phase or only either of them may be made to do so. The layer produced by solid phase growth is a polycrystal or single crystal layer oriented in the crystal face orientation of (111), for instance, same as the insulating layer 2b. Since this layer keeps the starting structure and hence shows a plane surface with a unified crystal face orientation, it has a homogeneous structure with the crystal interfaces extending regularly in the direction of the film thickness.

Figure 1B:
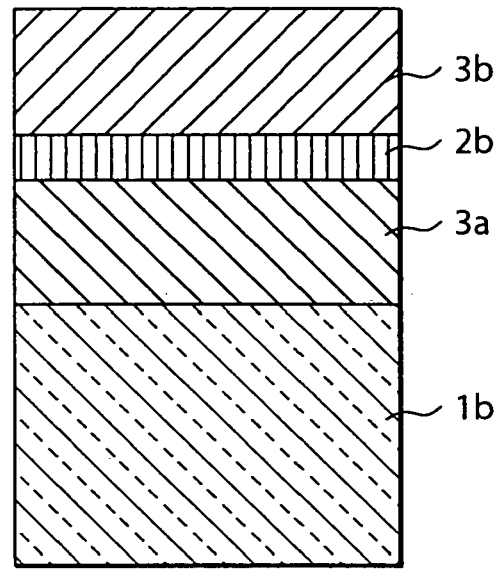

FIG. 1(b) is a schematic cross sectional view of another embodiment of semiconductor device according to the invention, illustrating its structure. Referring to FIG. 1(b), a first semiconductor layer 3a having a starting structure typically made of silicon is formed on a glass substrate 1b containing silicon. The layer is made to show a plane surface. Then, a second insulating layer 2b is formed on the first semiconductor layer 3a by epitaxial growth. It is made of oxide of a rare earth element, which may typically be cerium oxide ($CeO_2$) and shows a predetermined and unified crystal face orientation of (111), for instance. A second semiconductor layer 3b typically made of silicon and having an amorphous starting structure is formed on the second insulating layer 2b. The first and second semiconductor layers 3a and 3b are made to grow from an amorphous state into polycrystal or single crystal in a solid phase, using the crystalline insulating layer 2b as core. Note that both the first and second semiconductor layers 3a and 3b may be made to grow from an amorphous state into polycrystal or single crystal in a solid phase or only either of them may be made to do so. The layer produced by solid phase growth is a polycrystal or single crystal layer oriented in the crystal face orientation of (111), for instance, same as the insulating layer 2b.

The crystalline insulating layer 2b is not limited to a cerium oxide film layer if it is an insulating layer that can be made to epitaxially grow on a silicon layer.

Substances that can suitably be used for the crystalline insulating layer 2b include oxides of rare earth elements such as $Dy_2O_3$, $Y_2O_3$, $La_2O_3$, $Pr_2O_3$ and $Gd_2O_3$, perovskite type oxides such as $SiTiO_3$, $SrZrO_3$, $Sr(TiZr)O_3$ and $SrCeO_3$, rock salt structure type oxides such as MgO, CaO, SrO and BaO and spinel structure type oxides such as $MgAl_2O_4$ as well as $Al_2O_3$.

The crystal face orientation of the layer that is made to grow from an amorphous state into polycrystal or single crystal may be (111), (110) or (100) depending on the crystalline insulating layer that is used as core.

A field effect transistor (see FIGS. 3 and 5) having an SOI structure can be formed by using the first semiconductor layer 3a, the insulating layer 2b and the second semiconductor layer 3b of the obtained structure as shown in FIG. 1(a) or FIG. 1(b) respectively as channel region, gate insulating film and gate electrode.

Figure 2:
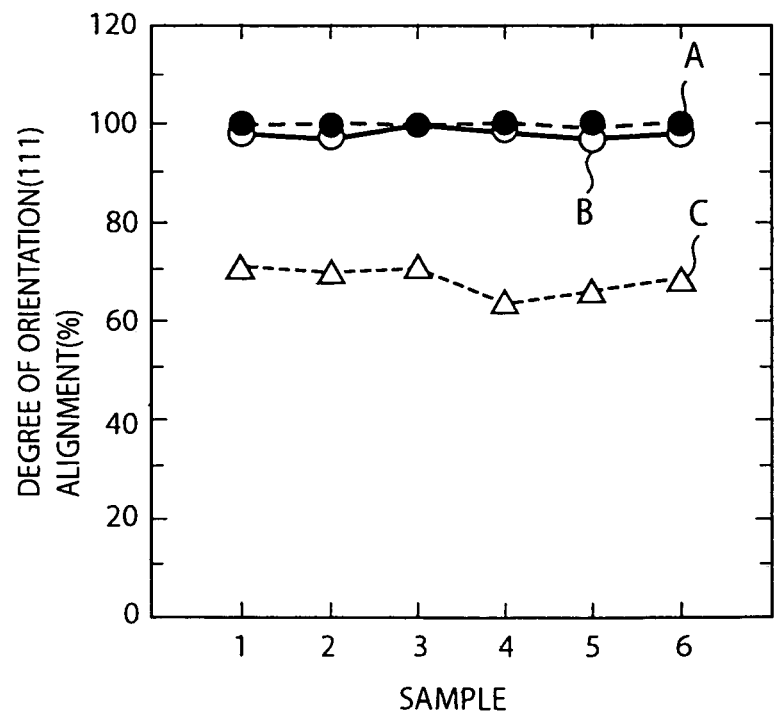
FIG. 2 is a graph illustrating the (111) orientation ratio of specimens of polycrystalline silicon film formed by a method according to the invention and adapted to be used for films 3a and 3b and that of specimens of polycrystalline silicon film formed by a known ion implanting method.

FIG. 2 is a graph illustrating the (111) orientation ratio of specimens of polycrystalline silicon film formed by a method according to the invention and adapted to be used for films 3a and 3b and that of specimens of polycrystalline silicon film formed by a known ion implanting method for the purpose of comparison along with specimens of single crystal silicon film also formed by a method according to the invention.

As seen from FIG. 2, all the specimens of single crystal silicon film formed by a method according to the invention were found to have been completely crystallized to single crystal as indicated by small dots A. All the specimens of polycrystal silicon film formed by a method according to the invention were found to have been uniaxially oriented in the (111) face orientation substantially by 100% as indicated by small circles B in FIG. 2. On the other hand, the specimens of polycrystal silicon film formed on an SOI substrate by a known ion implanting method were found to have been oriented in the (111) face orientation only by 70% at most, as indicated by small triangles C, proving that crystal grains oriented in directions other than the (111) face orientation had also been formed randomly.

When a field effect transistor is formed by using an insulating film 2b made of rare earth oxide such as cerium oxide that shows a high dielectric constant as gate insulating film, the dielectric constant of the gate insulating film is more than 8 so that the transistor can have an effective oxide film thickness (teff) of 1.0 nm and perform highly well with a reduced leak current.

Figure 3:
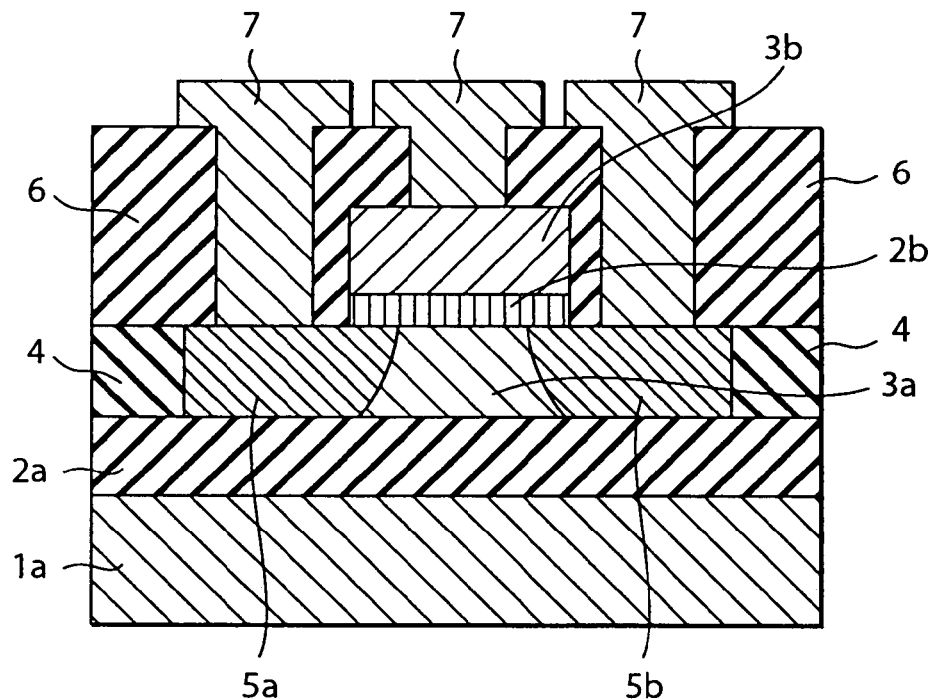
FIG. 3 is a schematic cross sectional view of an n-channel transistor having an SOI structure according to the invention.

FIG. 3 is a schematic cross sectional view of an n-channel field effect transistor having an SOI structure and formed by a method according to the invention.

As shown in FIG. 3, a buried insulating film 2a typically made of silicon oxide is formed on a silicon substrate 1a. The first insulating film 2a shown in FIG. 1(a) can be used for the buried insulating film 2a.

Element isolation films 4 typically made of silicon oxide are also formed on the silicon substrate 1a. A p type single crystal silicon layer 3a is formed on the buried insulating film 2a between the element isolation films 4.

The semiconductor layer 3a shown in FIG. 1(a) can be used for the p type silicon layer 3a. For example, this layer is formed by causing semiconductor to grow from an amorphous state into single crystal in a solid phase, using the epitaxially grown crystalline insulating film 2b as core.

An n type single crystal silicon layer 3b is formed on the gate insulating film 2b. The second semiconductor layer 3b shown in FIG. 1(a) can be used for the silicon layer 3b. For example, this layer can also be formed by causing semiconductor to grow from an amorphous state into single crystal in a solid phase, using the epitaxially grown crystalline insulating film 2b as core.

Subsequently, a pattern of a gate electrode 3b and that of a gate insulating film 2b are formed by respectively etching the silicon layer 3b and the crystalline insulating film by means of photolithography. An n type source diffusion region 5a and an n type drain diffusion region 5b are formed in the silicon layer 3a at the respective opposite sides of the gate electrode and the gate insulating film typically by implanting phosphor ions. The gate insulating film 2b may correspond to the second insulating layer 2b in FIG. 1(a).

An interlayer insulating film made of silicon oxide film and formed typically by CVD is deposited on the entire front surface and contact holes are produced respectively on the source diffusion region 5a and the drain diffusion region 5b. Then, Al electrodes 7 that operate as wires are formed by sputtering and then patterned.

Figure 4:
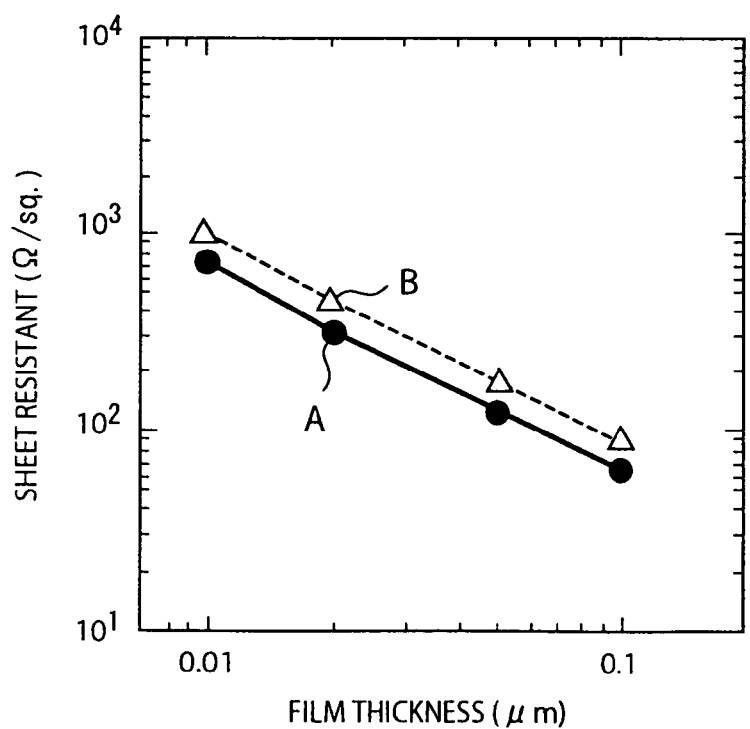
FIG. 4 is a graph illustrating the relationship between the sheet resistance and the film thickness of a polycrystal silicon film formed according to the invention and that of a polycrystalline silicon film formed by a known method.

Referring now to FIG. 4, curve A illustrates the relationship between the film thickness and the sheet resistance of a polycrystal silicon film formed according to the invention and oriented in the (111) face orientation. For the purpose of comparison, an amorphous silicon film was formed on a known silicon oxide film and turned into randomly oriented polycrystal by heat treatment. Curve B in FIG. 4 illustrates the relationship between the film thickness and the sheet resistance of the polycrystalline silicon film formed for the purpose of comparison.

Figure 5:
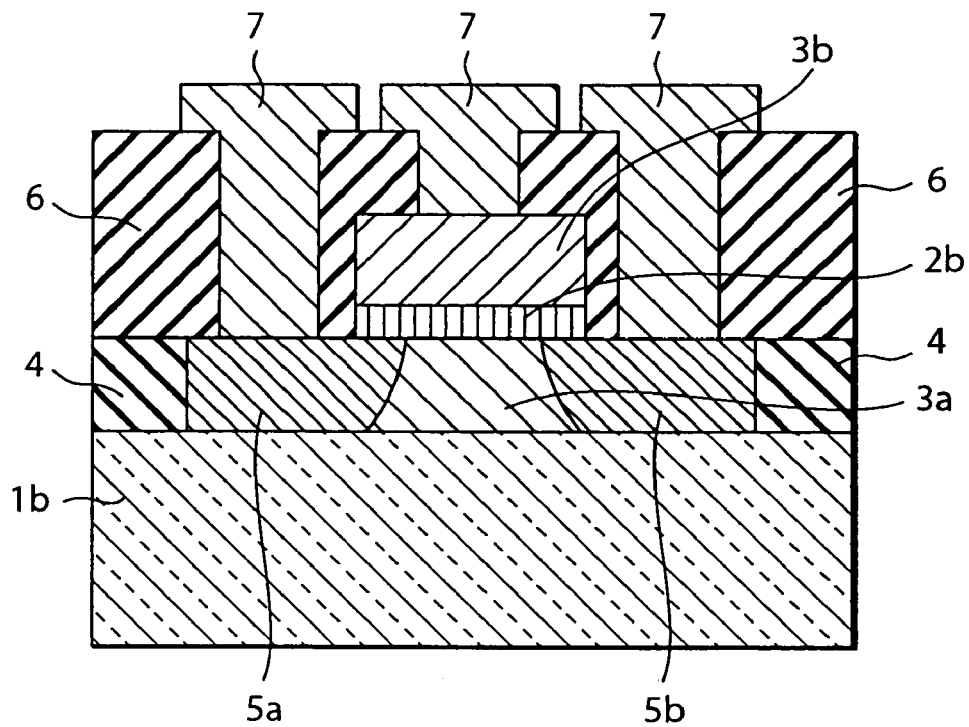
FIG. 5 is a schematic cross sectional view of a thin film transistor according to the invention.

FIG. 5 is a schematic cross sectional view of a thin film transistor according to the invention, which is formed by utilizing a polycrystal silicon film that is oriented in the (111) face orientation.

Referring to FIG. 5, a polycrystal silicon film oriented in the (111) face orientation is formed on a glass substrate 1b. The first semiconductor layer 3a shown in FIG. 1(b) can be used for the polycrystal silicon film 3a. This layer is formed by causing semiconductor to grow from an amorphous state into polycrystal in a solid phase, using the grown and highly oriented crystalline insulating film 2b as core.

An n type source diffusion region 5a and an n type drain diffusion region 5b are formed in the polycrystal silicon layer 3a typically by implanting phosphor ions. A gate insulating film 2b that is typically made of oxide of a rare earth element such as cerium oxide is formed on the polycrystal silicon layer 3a. The epitaxially grown crystalline insulating layer 2b shown in FIG. 1(b) can be used for the gate insulating film 2b.

A gate electrode 3 that is typically made of n type polycrystal silicon is formed on the insulating layer 2b. The second semiconductor layer electron beam shown in FIG. 1B can be used for the gate electrode 3. This layer is formed by causing semiconductor to grow from an amorphous state into single crystal in a solid phase, using the epitaxially grown crystalline insulating film 2b as core.

An interlayer insulating film made of silicon oxide film and formed typically by CVD is deposited on the entire front surface and contact holes are formed respectively on the source diffusion region 5a and the drain diffusion region 5b. Then, Al electrodes 7 that operate as wires are formed by sputtering and then patterned.

Figure 6:
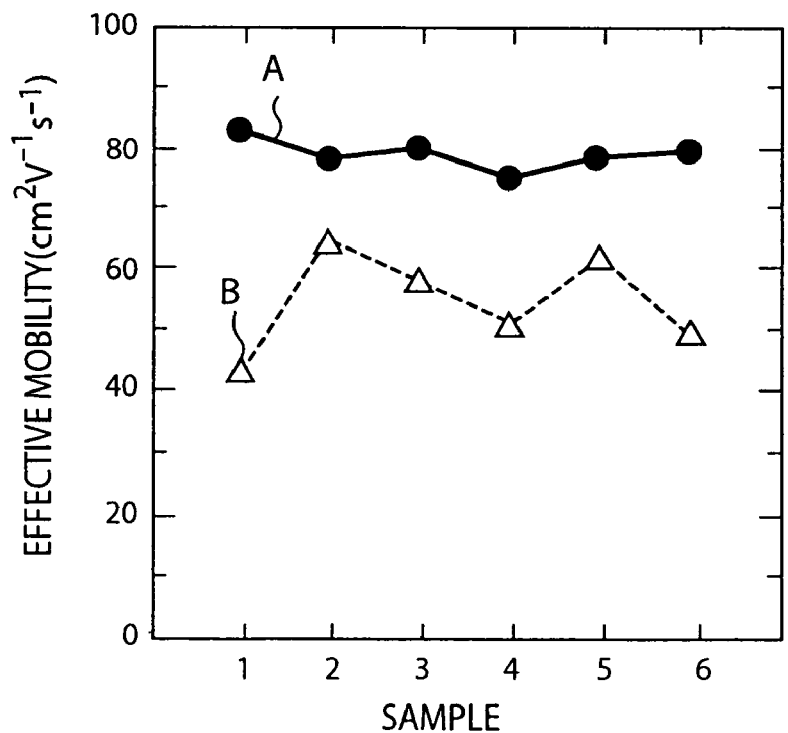
FIG. 6 is a graph illustrating the effective mobility of specimens of polycrystal silicon film formed according to the invention and that of specimens of polycrystalline silicon film formed by a known method.

FIG. 6 shows the effective mobility of specimens of the polycrystal silicon film 3a oriented in the (111) face orientation that is used as channel in the field effect transistor. For the purpose of comparison, there is also shown the effective mobility of specimens of a known polycrystal silicon film formed by depositing an amorphous silicon film on a glass substrate and turning it into polycrystal by means of a laser that is used as channel in a conventional field effect transistor.

As seen from FIG. 6, the known polycrystal silicon film used as channel showed a low effective mobility ($\mu$eff) of 40 $cm^2V^{-1}s^{-1}$ to 60 $cm^2V^{-1}s^{-1}$ and the specimens revealed dispersion to a large extent due to scattering of carriers at crystal grain boundaries as evidenced by curve B. To the contrary, the polycrystal silicon film according to the invention and oriented in the (111) face orientation showed an improved effective mobility of about 80 $cm^2V^{-1}s^{-1}$ and the specimens revealed dispersion only to a slight extent when it is used as channel.

This is because the polycrystal silicon film according to the invention is oriented in the (111) face orientation and hence carriers scattering at crystal grain boundaries showed an even potential energy level so that consequently the channel resistance falls to raise the effective mobility.

Now, a specific method of manufacturing a semiconductor device according to the invention will be described by referring to FIG. 7. With this method, an amorphous semiconductor layer is formed on a substrate carrying an insulating layer and the insulating layer is made to epitaxially grow. Then, the amorphous semiconductor layer is made to grow into polycrystal in a solid phase, using the epitaxially grown insulating layer.

Figure 7A:
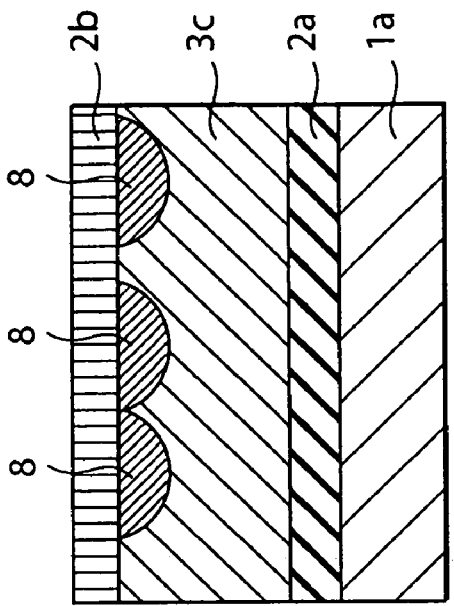
FIGS. 7(a) through 7(d) are schematic cross sectional views of a semiconductor device in different major manufacturing steps of an embodiment of method of manufacturing a semiconductor device according to the invention.

Firstly, as shown in FIG. 7(a), a p type silicon substrate 1a showing a face orientation of (100) and a specific resistance of 4 Ωcm to 6 Ωcm is brought in and an about 0.1 im thick silicon oxide film 2a is formed on the surface of the p type silicon substrate by an ordinary thermal oxidation technique. Then, an amorphous silicon film 3c is formed on the silicon oxide film 2a typically by CVD, using monosilane gas ($SiH_4$) or disilane gas ($Si_2H_6$). The film thickness of the amorphous silicon film 3c can be regulated to any value depending on the function element to be formed on the basis of the film. Practically, the film thickness is 0.5 im at maximum.

Thereafter, an about 5 nm thick crystalline insulating film 2b of cerium oxide or the like is formed by epitaxial growth, using a molecular beam epitaxy (MBE) method. More specifically, the cerium oxide film 2b can be made to be a single crystal film or a polycrystal film having a desired grain size by epitaxial growth and by controlling the film forming conditions.

In an experiment, a $CeO_2$ film was formed by molecular beam epitaxy (MBE), using metal Ce and ozone ($O_3$) as source materials. The $CeO_2$ film was produced on an amorphous layer by heating the substrate to a temperature level between 300 and 600° C. under ozone partial pressure between $5\times10^{-8}$ and $1\times10^{-7}$ Torr. Under these conditions, it was confirmed by X-ray diffractometry that the $CeO_2$ had been oriented to (110). $CeO_2$ was oriented to (110) when both the substrate temperature and the ozone partial pressure are low, whereas it was oriented to (111) when both the substrate temperature and the ozone partial pressure are high. In other words, it was found that the orientation of $CeO_2$ can be controlled appropriately by controlling the film forming conditions for the MBE method.

Single crystal is produced when the substrate temperature is between 500 and 600° C. and oxygen is supplied at a rate one to two times greater than the rate of supplying cerium in the film forming process. On the other hand, polycrystal is produced when the substrate temperature is between 300 and 500° C. The crystal grain size is small when the film forming process is conducted at low temperature. Polycrystal is also produced when oxygen is supplied at a rate two to five times greater than the rate of supplying cerium.

Figure 7D:
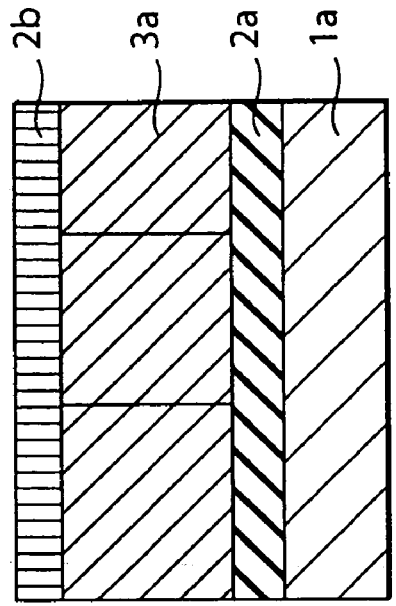
Figure 7B:
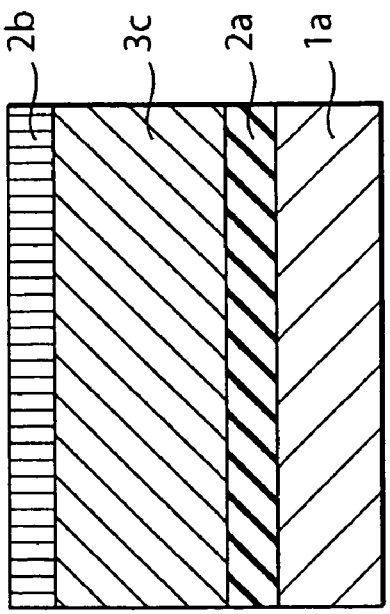

As a heat treatment operation is conducted in a nitrogen atmosphere at 600° C., cores 8 of silicon crystal begin to be produced along the interface of the cerium oxide film 2b and the amorphous silicon film 3c, using the cerium oxide film 2b as core, as shown in FIG. 7(b). This is because the crystal core generating rate is raised as the cerium oxide film is crystallized and the cores 8 grow to succeed the crystallinity.

Figure 7C:
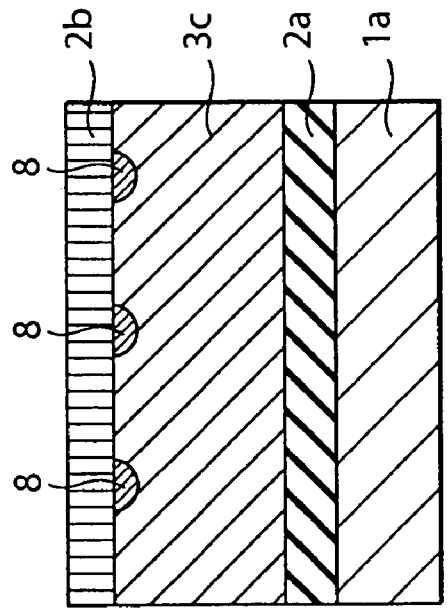

As shown in FIG. 7(c), the cores 8 grow further as the heat treatment continues.

As shown in FIG. 7(d), the silicon film 3a is made to grow into polysilicon in a solid phase after as a result of the heat treatment which it is conducted for about an hour. If the insulating layer that operates as core is oriented to (111), the produced polysilicon film 3a is also oriented to (111).

In the above experiment, the heat treatment was conducted at 600° C. to crystallize amorphous silicon film 3c. However, the temperature of the heat treatment is not limited thereto and crystallization proceeds at lower temperature, e.g., at 500° C. In other words, it is possible to produce a polycrystal silicon layer on a glass substrate that shows a melting point lower than a silicon substrate.

Since a high quality polycrystal silicon layer can be produced by causing amorphous silicon to grow in a solid phase while the latter is held in contact with a crystalline insulating layer, it is possible to suppress the risk of producing projections that is normally observed when amorphous silicon is deposited and crystallized on a silicon film that has been oxidized by a conventional laser annealing process. Therefore, the pressure resistance and the distribution of the produced polycrystal silicon are greatly improved.

While the insulating film 2b is made of cerium oxide and the amorphous silicon of the film 3c is crystallized from above in the above experiment, the present invention is not limited to such a mode of crystallization. For example, it is also possible to form an insulating film of oxide of a rare earth element such as cerium oxide on a silicon substrate and deposit amorphous silicon thereon so that the latter may be made to grow from below in a solid phase.

It is also possible to use cerium oxide between a floating gate layer and a control gate layer and both the silicon film of the floating gate and that of the control gate may be made to grow in a solid phase simultaneously typically for a nonvolatile memory. Then, the dispersion of the threshold value of the nonvolatile memory can be remarkably improved.

Additionally, it is also possible to turn the silicon film of the gate electrode of an ordinary transistor structure into single crystal by a method according to the present invention.

Now, another embodiment of method of manufacturing a semiconductor device according to the invention will be described by referring to FIGS. 8(a) through 8(f). With this method, an amorphous semiconductor layer is formed on a substrate carrying an insulating layer and then an insulating layer is made to epitaxially grow. Then, the amorphous semiconductor layer is made to grow into single crystal in a solid phase, using the epitaxially grown insulating layer as core. Finally, the insulating layer is removed.

Figure 8E:
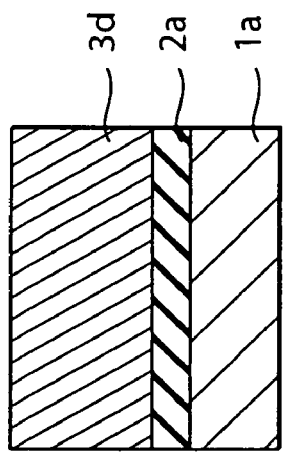
FIGS. 8(a) through 8(f) are schematic cross sectional views of a semiconductor device having a single crystal silicon gate electrode in different major manufacturing steps of another embodiment of method of manufacturing a semiconductor device according to the invention.
Figure 8F:
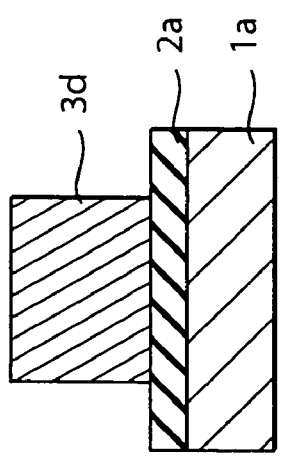
Figure 8C:
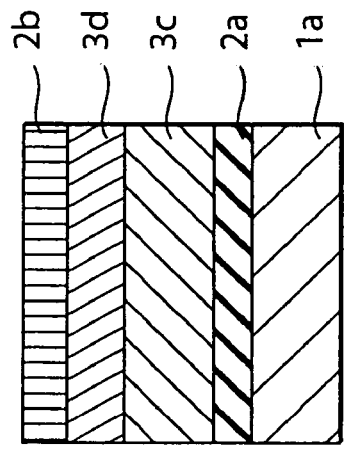
Figure 8D:
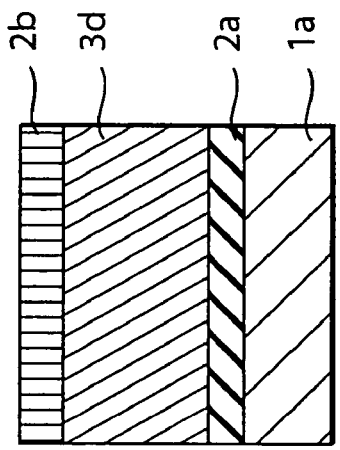
Figure 8A:
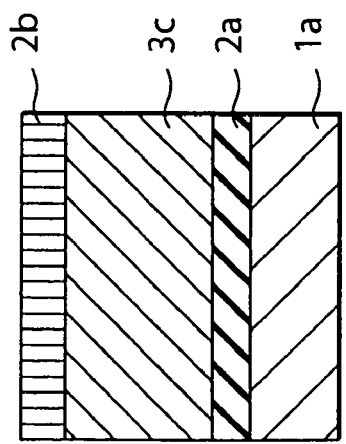

Firstly, as shown in FIG. 8(a), a p type silicon substrate 1a showing a face orientation of (100) and a specific resistance of 4 Ωcm to 6 Ωcm is brought in and an about 0.2 nm thick silicon oxide film 2a is formed on the surface of the p type silicon substrate by combusting a mixture gas of hydrogen and oxygen. Subsequently, the silicon oxide film is exposed to an atmosphere of ammonia gas in order to introduce nitrogen atoms and produce an oxinitride film 2a.

Then, a 0.2 im thick amorphous silicon film 3c is formed on the silicon oxinitirde film 2a by CVD, using monosilane gas ($SiH_4$) or disilane gas ($Si_2H_6$).

Thereafter, an about 5 nm thick crystalline insulating film 2b of cerium oxide or the like is formed by epitaxial growth, using a molecular beam epitaxy (MBE) method. More specifically, the cerium oxide film 2b can be made to grow from single crystal to a polycrystal film having a desired grain size by epitaxial growth and by controlling the film forming conditions. For instance, single crystal is produced when the substrate temperature is between 500 and 600° C. and oxygen is supplied at a rate one to two times greater than the rate of supplying cerium in the film forming process. On the other hand, polycrystal is produced when the substrate temperature is between 300 and 500° C. The crystal grain size is small when the film forming process is conducted at relatively low temperature. Polycrystal is also produced when oxygen is supplied at a rate two to five times greater than the rate of supplying cerium.

Figure 8B:
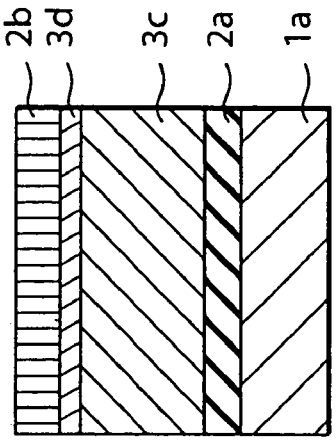

Then, as shown in FIG. 8(b), a heat treatment operation is conducted in a nitrogen atmosphere at 600° C. to make the amorphous silicon film 3c to grown into a single crystal silicon layer 3d in a solid phase from the side of the interface of the cerium oxide film 2b and the amorphous silicon film 3c, using the cerium oxide film 2b as core.

Thereafter, as shown in FIG. 8(c), the single crystal silicon 3d grows as the heat treatment continues.

As shown in FIG. 8(d), the single crystal silicon layer 3d grows completely in a solid phase after as a result of the heat treatment which it is conducted for about an hour, consequently a defect-free silicon layer is obtained.

Then, as shown in FIG. 8(e), the cerium oxide film 2b is exfoliated by using a dilute hydrofluoric acid solution.

Thereafter, as shown in FIG. 8(f), a gate electrode section 3d is produced out of the single crystal silicon layer 3a as the latter is subjected to a patterning process, using resist, and then to an etching process that employs a reactive ion etching method.

Although not shown in FIGS. 8(a) through 8(f), subsequently a source diffusion region and a drain diffusion region are formed by implanting phosphor ions at a rate of $1 \times 1,016$ cm$^{-2}$ in a heat treatment conducted at 950° C. for 30 seconds, using the single crystal silicon film 3d as mask in a manner as described above by referring to FIG. 3. Subsequently, a 300 nm thick silicon oxide film is deposited on the entire surface by CVD. Then, contact holes are produced in the silicon oxide film by anisotropic dry etching. Thereafter, an 800 nm thick aluminum film containing silicon and copper by 0.5% each is formed thereon and subsequently subjected to a patterning process to produce a source electrode and a drain electrode. In this way, a transistor structure can be produced, as a functional element.

Figure 9:
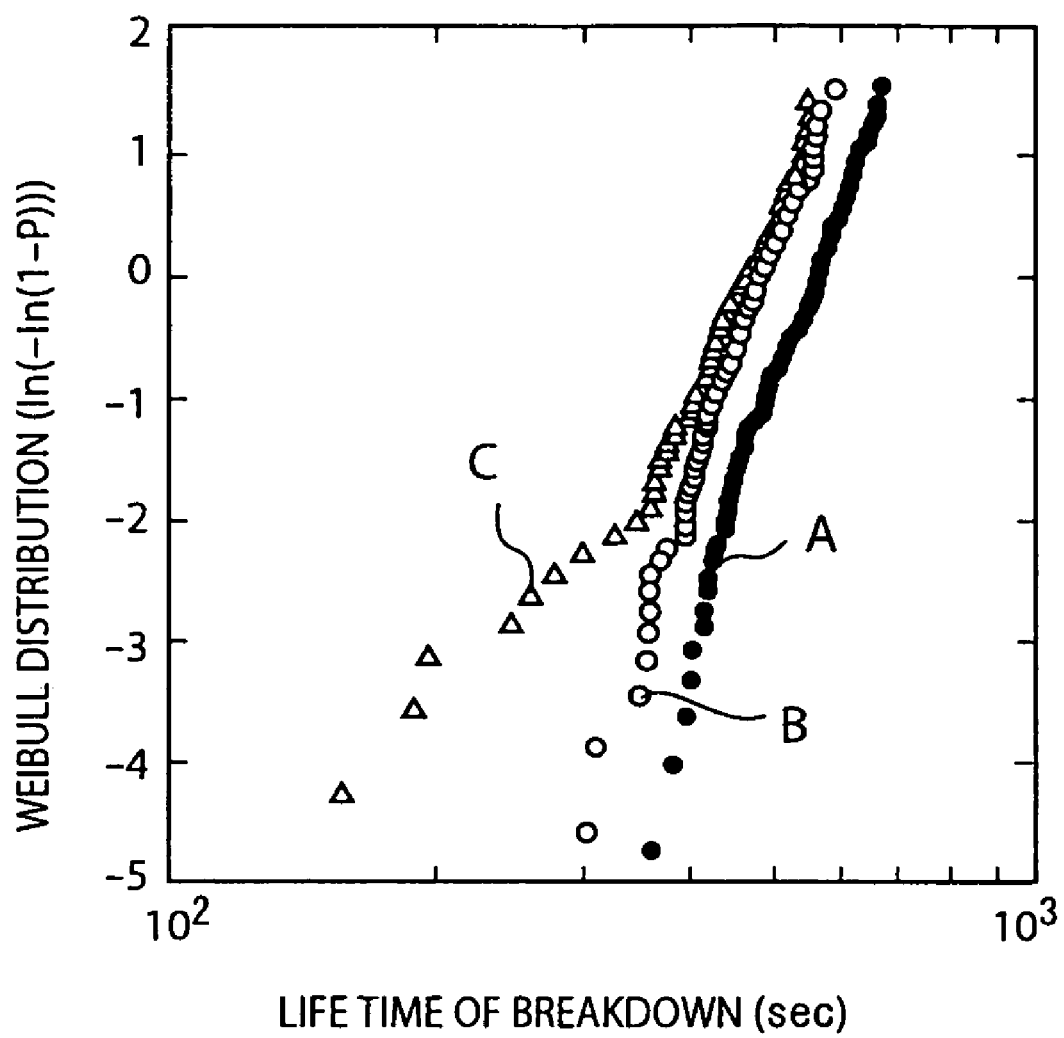
FIG. 9 is a graph illustrating the Weibull distribution of dielectric breakdown life of polysilicon film and single crystal film formed according to the invention and that of polycrystal film formed by a known method.

FIG. 9 is a graph illustrating the distribution of specimens of MOS capacitor in terms of service life to dielectric breakdown, which was obtained as a result of an experiment. The MOS capacitor was prepared by forming an epitaxially grown crystalline gate insulating film and subsequently a gate electrode thereon so as to be made to grow into single crystal or polycrystaly in a solid phase, using the gate insulating film as core, according to the invention. For the purpose of comparison, the graph also shows the distribution of specimens of MOS capacitor having a gate electrode made of silicon oxide and formed on a gate insulating film so as to be turned into polytcrystal by heat treatment by means of a conventional method. The silicon substrates used for the experiment were of the n type.

Referring to FIG. 9, the distribution of the specimens of conventional polysilicon film was not uniform and widespread in terms of service life to dielectric breakdown as indicated by small triangles C because crystal grains are randomly oriented in the conventional polycrystal silicon film and hence the dopant (impurity) can partly moves into the channel region in the doping operation depending on the crystal azimuth.

To the contrary, the distribution of the specimens of polycrystal silicon film formed by using polycrystal silicon oriented to (111) and having a crystal grain size that was controlled in the solid phase growth was uniform in terms of service life to dielectric breakdown as indicated by small circles B in FIG. 9 because the polycrystal silicon film was made to show a homogeneous crystallinity.

Furthermore, when the gate electrode was turned into single crystal by controlling the conditions for forming the cerium oxide film according to the invention, the distributions of the specimens was made further uniform in terms of service life to dielectric breakdown as evidenced by the dots A in FIG. 9. As a result, the service life of the MOS capacitor is further prolonged.

In the case of the embodiment of manufacturing method described above by referring to FIGS. 8A through 8F, the gate electrode was formed by patterning the semiconductor layer 3d that had been made to grow in a solid phase, using the epitaxial insulating film 2a as core. However, the present invention is by no means limited thereto and it is possible to prepare a SOI substrate by removing the epitaxial insulating film shown in FIG. 8(e).

FIGS. 10(a) through 10(f) show still another embodiment of method of manufacturing a semiconductor device according to the invention, which is a method of manufacturing a SOI substrate.

Firstly, as shown in FIG. 10(a), a p type silicon substrate 1a showing a face orientation of (100) and a specific resistance of 4 Ωcm to 6 Ωcm is brought in and an about 0.1 im or more thick silicon oxide film 2a is formed on the surface of the p type silicon substrate by combusting a mixture gas of hydrogen and oxygen.

Then, as shown in FIG. 10(b), a 0.2 im thick amorphous silicon oxide film 3c is formed on the silicon oxide film 2a by CVD, using monosilane gas ($SiH_4$) or disilane gas ($Si_2H_6$).

Thereafter, as shown in FIG. 10(c), an about 5 nm thick insulating film 2b of cerium oxide or the like is formed by epitaxial growth, using a molecular beam epitaxy (MBE) method. More specifically, the cerium oxide film 2b can be made to grow from single crystal to a polycrystal film having a desired grain size by epitaxial growth and by controlling the film forming conditions. For instance, single crystal is produced when the substrate temperature is between 500 and 600° C. and oxygen is supplied at a rate one to two times greater than the rate of supplying cerium in the film forming process. On the other hand, polycrystal is produced when the substrate temperature is between 300 and 500° C. The crystal grain size is small when the film forming process is conducted at relatively low temperature. Polycrystal is also produced when oxygen is supplied at a rate two to five times greater than the rate of supplying cerium.

Then, as shown in FIG. 10(d), a heat treatment operation is conducted in a nitrogen atmosphere at 600° C. to make the amorphous silicon film 3c to grown into a single crystal silicon layer 3d in a solid phase from the side of the interface of the cerium oxide film 2b and the amorphous silicon film 3c, using the cerium oxide film 2b as core.

Thereafter, as shown in FIG. 10(e), the single crystal silicon 3d grows as the heat treatment continues. The single crystal silicon layer 3a grows completely in a solid phase after as a result of the heat treatment which it is conducted for about an hour.

Then, as shown in FIG. 10(f), a SOI substrate is produced when the cerium oxide film 2b is exfoliated by using a dilute hydrofluoric acid solution.

If necessary, the produced SOI substrate may be subjected to a dehydrogenation process, a deoxygenation process and/or a defects removing process, using a high temperature heat treatment. Additionally, the surface of the single crystal silicon layer 3d may be planarized by chemical mechanical polishing or sacrificial oxidation using active oxygen.

Still additionally, the single crystal silicon layer 3d may be made to increase its film thickness after exfoliating the cerium oxide film 2b by causing silicon to grown in a vapor phase epitaxial growth process, using the single crystal silicon film 3d as under layer.

The above described SOI substrate can be manufactured at low cost as the number of manufacturing steps is reduced if compared with an SOI substrate produced by a conventional method such as ion implantation or bonding. Additionally, a desired SOI structure can be produced without difficulty because the film thickness of the silicon layer on the oxide film can be controlled by controlling the film thickness of the amorphous silicon film 3c. Furthermore, since the manufacturing method does not involve any ion implantation, any possibility of introducing defects into the single crystal silicon film is eliminated.

Figure 11:
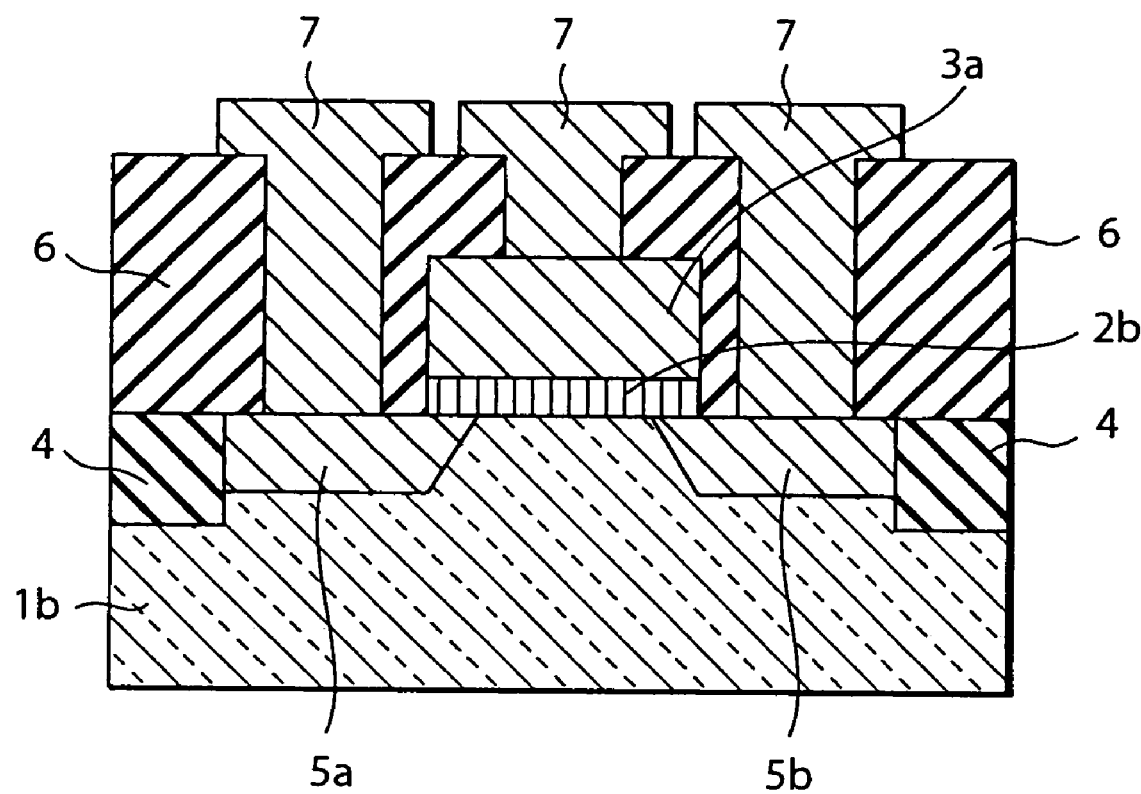
FIG. 11 is a schematic cross sectional view of an n-channel transistor according to the invention.

FIG. 11 is a schematic cross sectional view of an n-channel MIS transistor according to the invention.

The illustrated transistor is formed by forming a gate insulating film on a single crystal semiconductor substrate by epitaxial growth and subsequently forming a gate electrode of single crystal silicon thereon also by epitaxial growth.

Referring to FIG. 11, element isolation films 4 are formed on a p type (111) silicon substrate 1b by an ordinary selective oxidation method. An n type source diffusion region 5a and an n type drain diffusion region 5b are formed in the silicon substrate 1b typically by ion implantation.

Additionally, a gate insulating film 2b made of oxide of a rare earth element such as cerium oxide is formed on the surface of the silicon substrate 1 by epitaxial growth. Furthermore, a single crystal silicon layer 3a is formed thereon also by epitaxial growth.

Then, a silicon oxide film 6 is formed on the entire surface by CVD and Al electrodes 7 that operates as wires are formed in the respective contact holes that are cut through the silicon oxide film 6 by laying an aluminum film by sputtering and patterning the aluminum film.

A highly effective interface can be produced between the gate insulating film 2b and the silicon substrate 1b of a field effect transistor having a configuration as described above. For instance, both the defects in the interface energy level density and the leak current due to a high dielectric constant of the gate insulating film 2b can be reduced to improve the channel mobility and other characteristics of the transistor.

Additionally, the transistors formed by a method according to the invention can be made to be highly homogeneous in terms of their characteristics to remarkably improve the reliability of the devices due to the fact that the gate electrode 3a is formed on the gate insulating film 2b by epitaxial growth.

Now, a method of manufacturing a field effect transistor will be described in detail by referring to FIGS. 12(a) through 12(g).

Firstly, as shown in FIG. 12(a), a p type silicon substrate 1a showing a face orientation of (100) and a specific resistance of 4 Ωcm to 6 Ωcm is brought in and an about 0.6 im thick silicon oxide film 4 is formed on the surface of the p type silicon substrate 1a by an ordinary selective oxidation method.

Then, an insulating film 2b of oxide of a rare earth element such as cerium oxide or the like is formed on the surface of the silicon substrate 1a by epitaxial growth, using a molecular beam epitaxy (MBE) method. In an experiment, a $CeO_2$ film was formed by heating the substrate to a temperature level between 650 and 850° C. under ozone partial pressure between $2\times10^{-7}$ and $1\times10^{-5}$ Torr. Under these conditions, it was confirmed that the $CeO_2$ had been oriented to (111).

Then, as shown in FIG. 12(b), a 200 nm thick amorphous silicon film 3c that makes a gate electrode is deposited on the cerium oxide film 2a.

Thereafter, as shown in FIG. 12(c), a single crystal silicon layer 3d is made to grow in a solid phase by typically subjecting the amorphous silicon film 3c to a heat treatment process conducted at 600° C. in a nitrogen atmosphere. Note that the amorphous silicon film electro-conductive epitaxially grows into single crystal to succeed the crystallinity of the cerium oxide film 2b.

Subsequently, as shown in FIG. 12(d), the single crystal layer 3d is subjected to a patterning operation, using a resist mask and then both the single crystal layer 3d and the cerium oxide film 2b are etched by reactive ion etching to produce a gate electrode 3d and a gate insulating film 2b.

Thereafter, as shown in FIG. 12(e), phosphor is introduced into regions that make respectively a source diffusion region 5a and a drain diffusion region 5b at a rate of $4\times10^{16}$ $cm^{-2}$ by phosphor ion implantation. At this time, implanted phosphor ions show a distribution pattern centered at a bottom whose position depends on the acceleration energy in the inside of the single crystal silicon gate electrode and also in the inside of the silicon substrate. Thereafter, a heat treatment is conducted at 900° C. for 30 seconds to activate the phosphor and hence the gate electrode 3d, the source diffusion region 5a and the drain diffusion region 5b.

Then, if necessary, a 25 nm thick titanium thin film and a 50 nm thick titanium nitride thin film are sequentially deposited on the entire surface by sputtering. Subsequently, all the titanium thin film may be forced to react with the silicon substrate by heat treating it at 700° C. for 1 minute in a nitrogen atmosphere to form a titanium silicide film only on the gate electrode 3d, the source diffusion layer 5a and the drain diffusion layer 5b. Thereafter, any unreacted titanium thin film is selectively peeled off from the titanium nitride film and the insulating film by means of an aqueous solution of hydrofluoric acid or a mixture solution of sulfuric acid and hydrogen peroxide.

Then, as shown in FIG. 12(f), a 300 nm thick silicon oxide film 6 is deposited on the entire surface by CVD. Subsequently, contact holes are produced in the silicon oxide film by anisotropic etching.

Thereafter, as shown in FIG. 12(g), an 800 nm thick aluminum film containing silicon and copper by 0.5% each is formed thereon and subsequently subjected to a patterning process to produce electrodes 7. Then, a heat treatment is conducted at 450° C. for 15 minutes in a nitrogen atmosphere containing hydrogen by 10%.

As a result, it is possible to form a gate insulating film 2b by epitaxial growth on the silicon substrate 1a and produce a field effect transistor comprising a gate electrode 3d that is made of single crystal silicon.

A field effect transistor produced in this way is relatively free from defects along the interface of the gate insulating film 2b and the silicon substrate 1a and the interface of the gate insulating film 2b and the gate electrode 3d.

Additionally, the transistor can have an effective oxide film thickness of 1.0 nm and perform highly well with a reduced leak current because the use of oxide of a rare earth element such as $CeO_2$ that shows a high dielectric constant for the gate insulating film 2b. Furthermore, transistors formed by this method of the present invention can be made to be highly homogeneous in terms of their characteristics to remarkably improve the reliability of the devices when the gate electrode is made of single crystal.

While the gate insulating film 2b is made of cerium oxide film in the above description, the present invention is by no means limited thereto and any insulating film that can be formed by epitaxial growth on a silicon substrate 1a can be used to provide a similar structure and similar effects for the purpose of the invention.

Substances that can suitably be used for an epitaxially grown insulating film for the purpose of the invention include, in addition to cerium oxide that is used for each and every embodiment described above, oxides of rare earth elements such as $Dy_2O_3$, $Y_2O_3$, $La_2O_3$, $Pr_2O_3$ and $Gd_2O_3$, perovskite type oxides such as $SiTiO_3$, $SrZrO_3$, $Sr(TiZr)O_3$ and $SrCeO_3$, rock salt structure type oxides such as MgO, CaO, SrO and BaO and spinel structure type oxides such as $MgAl_2O_4$ as well as $Al_2O_3$. An insulating film of any of such substances can be formed under appropriately selected conditions including temperature between 300 and 700° C. and oxygen partial pressure between $10^{-8}$ and $10^{-5}$ Torr if an MBE method is used.

While an amorphous silicon film is formed by using monosilane or disilane in the above description, the present invention is by no means limited thereto and compound gas such as $SiH_2Cl_2$ or $SiCl_4H_6$ may alternatively be used for forming an amorphous silicon film for the purpose of the invention.

Furthermore, while the structure, the manufacturing method and the characteristics of a transistor according to the invention are described above in terms of n-channel MOS transistors, similar effects can be obtained for p-channel MOS transistors.

Figure 13:
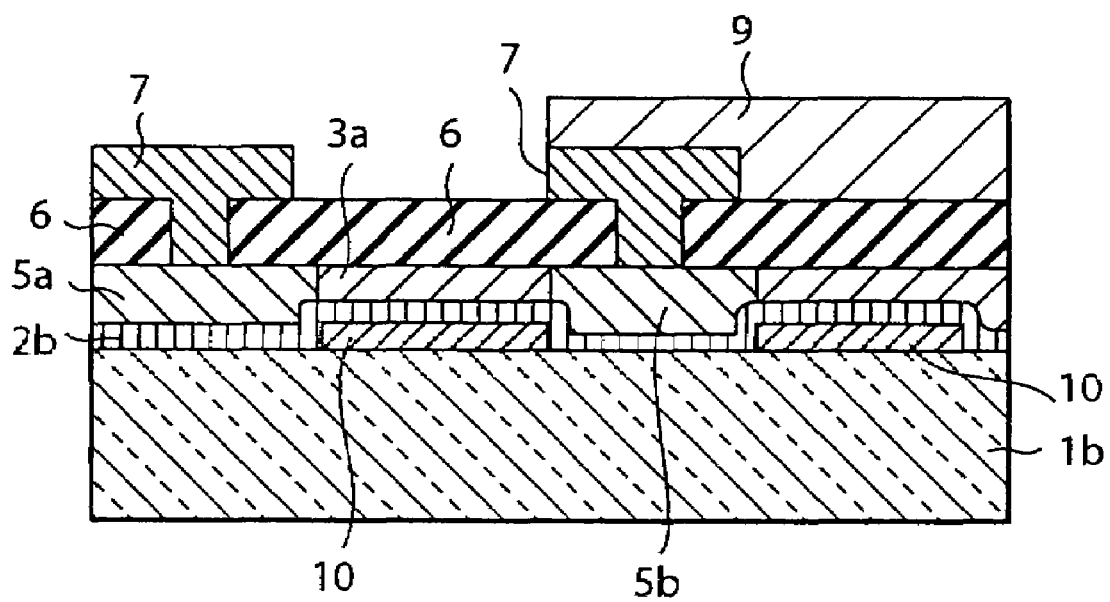
FIG. 13 is a schematic cross sectional view of a MIS thin film transistor according to the invention.

FIG. 13 shows a polycrystal thin film transistor (TFT) that can be used as pixel switching device for an organic EL device or a liquid crystal display. The present invention can be applied to a polycrystal thin film for forming channels. Referring to FIG. 13, metal films 10 are formed on a glass substrate 1b by typically patterning Mo and adapted to operate as gate electrode and auxiliary capacitive line and a crystalline insulating film 2b of $CeO_2$ is deposited thereon by epitaxial growth. Then, an amorphous silicon layer 3a is deposited further thereon. The amorphous silicon layer 3a is made to grow into a polycrystal layer in a solid phase, using the crystalline insulating film 2b as core. Source and drain regions 5a, 5b are formed in the polycrystal silicon layer by diffusion and a pixel electrode and a wiring layer (not shown) are connected thereto by way of an interlayer insulating film 6. The crystalline insulating film 2b is made to operate as gate insulating film without any modification. Thus, a MISTFT is produced in this way.

The above described embodiments can be modified in various different ways without departing from the spirit and the scope of the present invention.

Thus, according to the invention, there is provided a semiconductor device and a method of manufacturing the same that can improve the insulating effect of the gate insulating film, reduce the resistance of the gate electrode and improve the carrier mobility and the reliability of the channel silicon layer.

Additionally, according to the invention, there is provided a semiconductor device and a method of manufacturing the same by using a substrate that shows a SOI structure with a defect-free silicon layer and can be produced with a reduced number of manufacturing steps.

What is claimed is:

1. A method of manufacturing a semiconductor device comprising:
   depositing an amorphous Si layer directly on an insulating substrate containing Si;
   depositing a crystalline insulating layer oriented in a predetermined crystal face orientation by growing a $CeO_2$ layer on said amorphous Si layer;
   forming a polycrystal or single crystal semiconductor substrate by growing said amorphous Si layer in a solid phase, using said crystalline insulating layer of $CeO_2$ as core; and
   forming a functional element in said polycrystal or single crystal semiconductor substrate.

2. A method according to claim 1, wherein said insulating substrate is a glass substrate.

3. A method according to claim 1, wherein said insulating substrate is an $SiO_2$ substrate.

4. A method according to claim 1, wherein said insulating substrate is formed on a polycrystal or single crystal Si substrate.

5. A method according to claim 1, wherein the method further comprises
   depositing another amorphous Si layer on said crystalline insulating layer of $CeO_2$; and
   forming a polycrystal or single crystal layer by growing said other amorphous Si layer in a solid phase, using said crystalline insulating layer of $CeO_2$ as core.

* * * * *